United States Patent
Degura

(10) Patent No.: US 10,506,750 B2
(45) Date of Patent: Dec. 10, 2019

(54) BOARD WORK MACHINE AND RECOGNITION METHOD

(71) Applicant: FUJI CORPORATION, Chiryu-shi (JP)

(72) Inventor: Kazuya Degura, Chiryu (JP)

(73) Assignee: FUJI CORPORATION, Chiryu-shi (JP)

( * ) Notice: Subject to any disclaimer, the term of this patent is extended or adjusted under 35 U.S.C. 154(b) by 66 days.

(21) Appl. No.: 15/573,947

(22) PCT Filed: Jun. 12, 2015

(86) PCT No.: PCT/JP2015/066987
§ 371 (c)(1),
(2) Date: Nov. 14, 2017

(87) PCT Pub. No.: WO2016/199289
PCT Pub. Date: Dec. 15, 2016

(65) Prior Publication Data
US 2018/0295759 A1   Oct. 11, 2018

(51) Int. Cl.
*H05K 13/04* (2006.01)
*H05K 13/08* (2006.01)
*G06T 7/00* (2017.01)

(52) U.S. Cl.
CPC ....... *H05K 13/0473* (2013.01); *G06T 7/0006* (2013.01); *H05K 13/08* (2013.01); *H05K 13/0812* (2018.08); *G06T 2207/30164* (2013.01)

(58) Field of Classification Search
CPC ........ G06T 7/0006; G06T 2207/30164; H05K 13/0473; H05K 13/08; H05K 13/0812
See application file for complete search history.

(56) References Cited

U.S. PATENT DOCUMENTS 3,605,077 A  *  9/1971  Kaylor ................ H01R 4/206
                                                    439/730
3,693,230 A  *  9/1972  Morgan ................ H01R 4/20
                                                    29/753
(Continued)

FOREIGN PATENT DOCUMENTS

DE  29 19 850 A1  11/1980
JP  5-63396 A    3/1993
(Continued)

OTHER PUBLICATIONS

International Search Report dated Sep. 8, 2015, in PCT/JP2015/066987, filed Jun. 12, 2015.
(Continued)

*Primary Examiner* — Yubin Hung
(74) *Attorney, Agent, or Firm* — Oblon, McClelland, Maier & Neustadt, L.L.P.

(57) ABSTRACT

In a cut and clinch device, movable section 122 is slidable with respect to main body section 120. Also, a first insertion hole is formed in main body section 210, and a second insertion hole 136 is formed in curved section 133 of movable section 122 in a state overlapping the first insertion hole. A lead is cut by the movable section being slid with the lead inserted into the first insertion hole and the second insertion hole. In such a cut and clinch device, a pair of recognition marks 210 are provided on a bent section opposite each other centered around the second insertion hole. Thus, the recognition marks are imaged, and based on the image data, it is possible to appropriately recognize the opening position of the second insertion hole, to appropriately insert the lead into the second insertion hole, and to appropriately cut the lead.

4 Claims, 11 Drawing Sheets

(56) References Cited

U.S. PATENT DOCUMENTS

| | | | |
|---|---|---|---|
| 5,123,154 A | 6/1992 | Maskens et al. | |
| 6,477,766 B2 * | 11/2002 | Imai | H05K 13/0408 |
| | | | 29/741 |
| 2006/0164794 A1 * | 7/2006 | Kadota | H05K 13/0404 |
| | | | 361/600 |
| 2009/0080113 A1 * | 3/2009 | Chang | G11B 5/4846 |
| | | | 360/244 |
| 2014/0284751 A1 * | 9/2014 | Kamei | H01L 27/14618 |
| | | | 257/443 |

FOREIGN PATENT DOCUMENTS

| | | | | |
|---|---|---|---|---|
| JP | 5-175696 A | | 7/1993 | |
| JP | 06061696 A | * | 3/1994 | |
| JP | 2002-261493 A | | 9/2002 | |
| JP | 2005353901 A | * | 12/2005 | H01L 24/78 |
| JP | 2013-69893 A | | 4/2013 | |
| JP | 2013-258194 A | | 12/2013 | |
| WO | 2015/063827 A1 | | 5/2015 | |

OTHER PUBLICATIONS

Extended European Search Report dated May 30, 2018 in Patent Application No. 15894974.3, citing documents AA, AO and AP therein, 9 pages.

* cited by examiner

BOARD WORK MACHINE AND RECOGNITION METHOD

TECHNICAL FIELD

The present invention relates to a board work machine provided with a cutting device for cutting a lead of a leaded component, and to a recognition method for recognizing the position of a through-hole into which a lead of the cutting device is to be inserted.

BACKGROUND ART

A cutting device for cutting a lead of a leaded component, for example, is provided with a fixed section in which a first through-hole is formed, and a movable section that slides with respect to the fixed section and in which is formed a second through-hole that overlaps the first through-hole. Thus, the lead is cut by being inserted into the overlapping first through-hole and second through-hole, and then the movable section being slid. The patent literature below discloses examples of a cutting device.
Patent literature 1: JP-A-2002-261493
Patent literature 2: JP-A-H5-175696

SUMMARY OF INVENTION

Technical Problem

An object of the present invention is to appropriately cut a lead.

Solution to Problem

To solve the above problems, a board work machine of the present invention is a board work machine including: a cutting device provided with (A) a fixed section in which is formed a first through-hole and (B) a movable section configured to slide with respect to the fixed section and in which is formed a second through-hole configured to overlap the first through-hole, the cutting device being configured to cut a lead of a leaded component by the lead being inserted into the first through-hole and second through-hole that are in an overlapping state and the movable section being slid; a moving device configured to move the cutting device; and a recognition device configured to recognize a position of an upper through-hole that is an upper-positioned through-hole of the first through-hole and the second through-hole that are in the overlapping state, based on image data of one of the fixed section and the movable section in which the uppermost through-hole is formed.

To solve the above problems, a recognition method of the present invention is a recognition method for, in a cutting device provided with (A) a fixed section in which is formed a first through-hole and (B) a movable section configured to slide with respect to the fixed section and in which is formed a second through-hole configured to overlap the first through-hole and configured to cut a lead of a leaded component by the lead being inserted into the first through-hole and second through-hole that are in an overlapping state and the movable section being slid, recognizing a position of an upper through-hole that is an upper-positioned through-hole of a first through-hole and a second through-hole that are in the overlapping state, the recognition method including: imaging of the one of the fixed section and the movable section in which the upper through-hole is formed; and recognizing the position of the upper through-hole based on image data obtained by the imaging.

Advantageous Effects

With a board work machine and a recognition method of the present invention, a position of an upper through-hole that is one of the first through-hole and the second through-hole that overlap is recognized based on image data of one of the fixed section and the movable section in which the upper through-hole is formed. Thus, it is possible to appropriately recognize the position of the upper through-hole, and to insert the lead into the through-holes and appropriately cut the lead.

DESCRIPTION OF PREFERRED EMBODIMENTS

Figure 1:
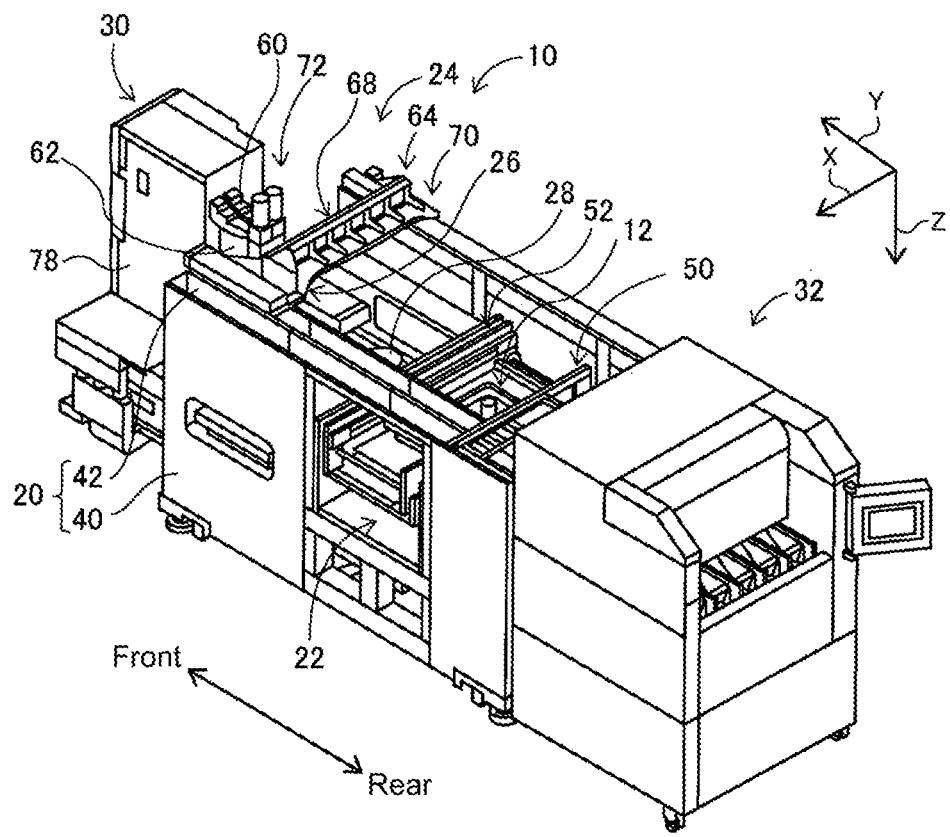
FIG. 1 is a perspective view of a component mounter.

The following describes in detail referring to the figures an example embodiment of the present invention.
Configuration of Component Mounter
FIG. 1 shows component mounter 10. Component mounter 10 performs work of mounting components on circuit board 12. Component mounter 10 is provided with device main body 20, board conveying and holding device 22, component mounting device 24, mark camera 26, component camera 28, component supply device 30, loose component supply device 32, cut and clinch device (refer to FIG. 3) 34, and control device (refer to FIG. 8) 36. Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
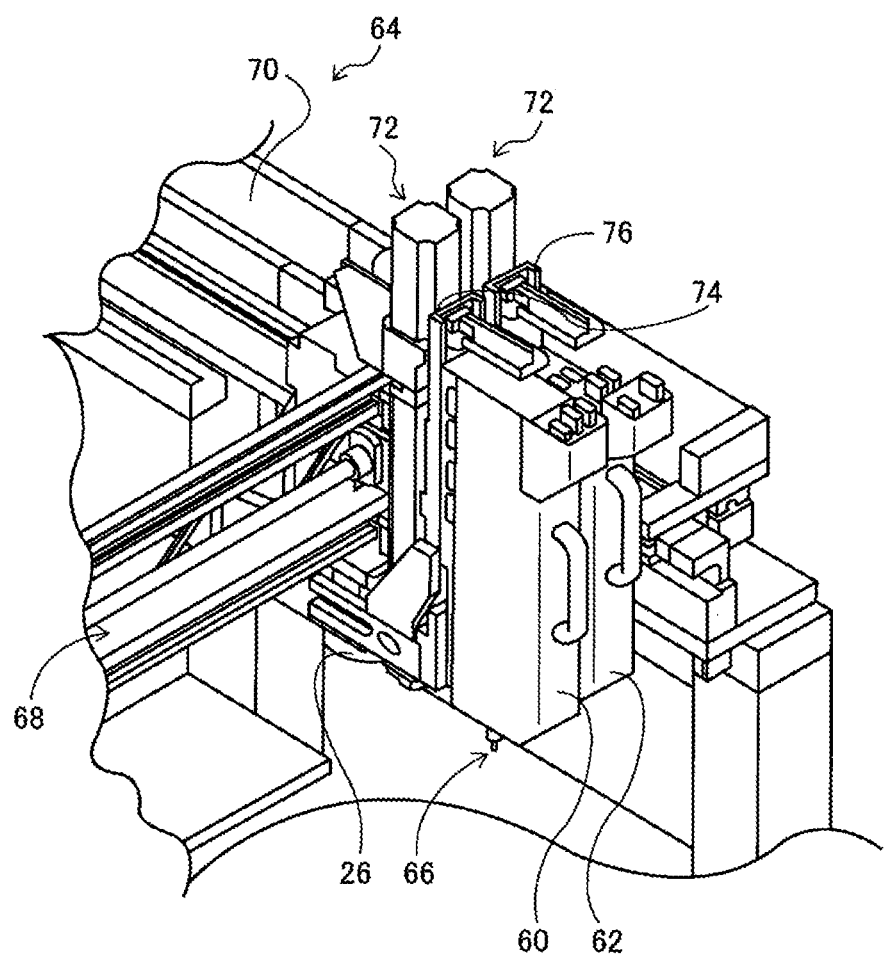
FIG. 2 is a perspective view of a component mounting device.

Component mounting device 24 is provided on beam section 42, and includes work heads 60 and 62 and work head moving device 64. As shown in FIG. 2, suction nozzle 66 is provided on a lower surface of each work head 60 and 62, with a component being picked up and held by the suction nozzle 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, work heads 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Mark camera 26 is attached to slide 74 in a state facing downwards, and is moved in the X direction, Y direction, and Z direction together with work head 60. Thus, mark camera 26 images any position on frame section 40. As shown in FIG. 1, component camera 28 is provided in a state facing upwards on frame section 40 between board conveying and holding device 22 and component supply device 30. Thus, component camera 28 images a component held by suction nozzle 66 of work heads 60 or 62.

Component supply device 30 is provided at an end of frame section 40 in the front-rear direction. Component supply device 30 includes tray-type component supply device 78 and feeder-type component supply device (refer to FIG. 8) 80. Tray-type component supply device 78 supplies components in a state arranged in a tray. Feeder-type component supply 80 device supplies components via a tape feeder or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. Note that, components supplied by component supply device 30 and loose component supply device 32 may include electronic circuit components, configuration components of solar panels, configuration components of power modules, and the like. Also, electronic circuit components include components with leads and components without leads.

Figure 3:
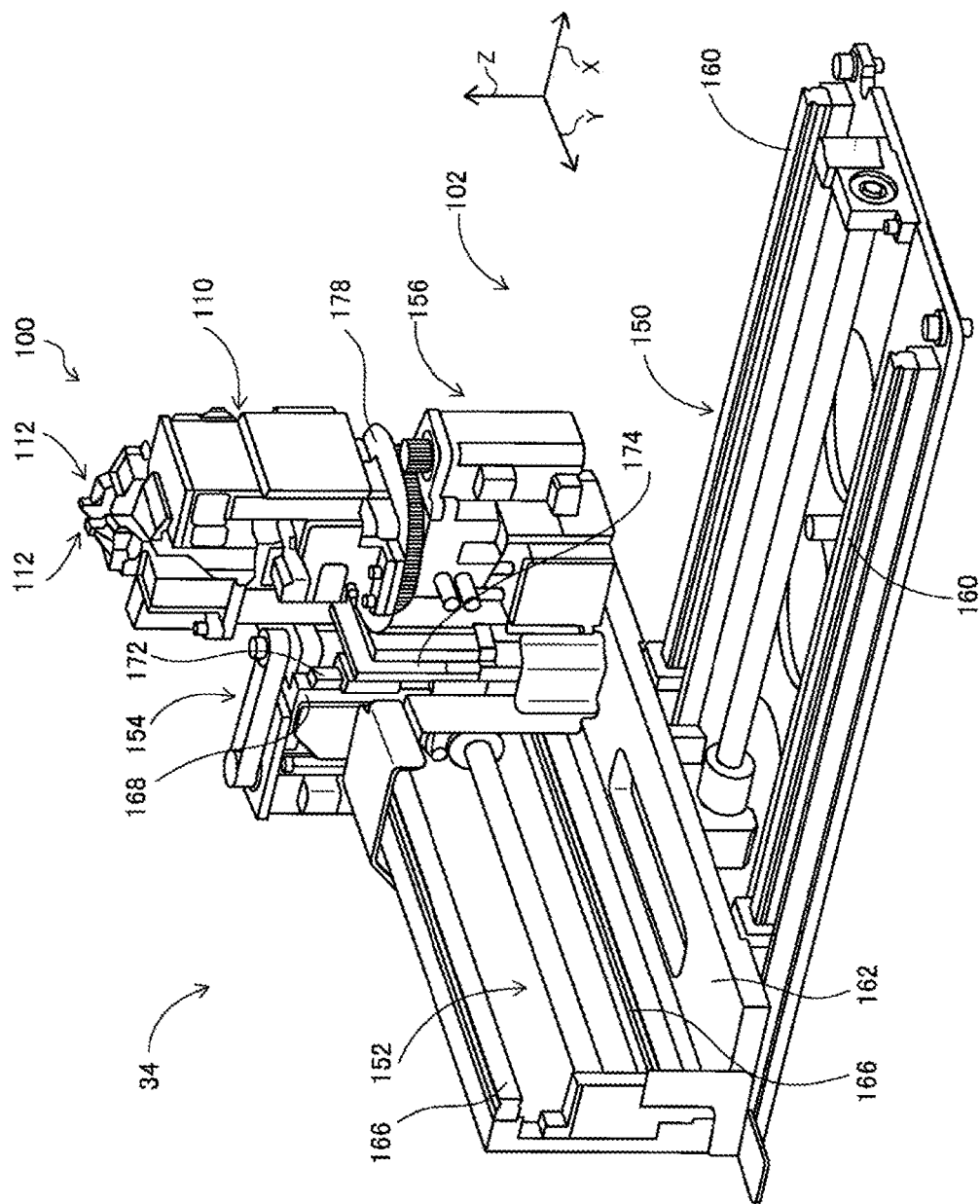
FIG. 3 is a perspective view of a cut and clinch device.
Figure 4:
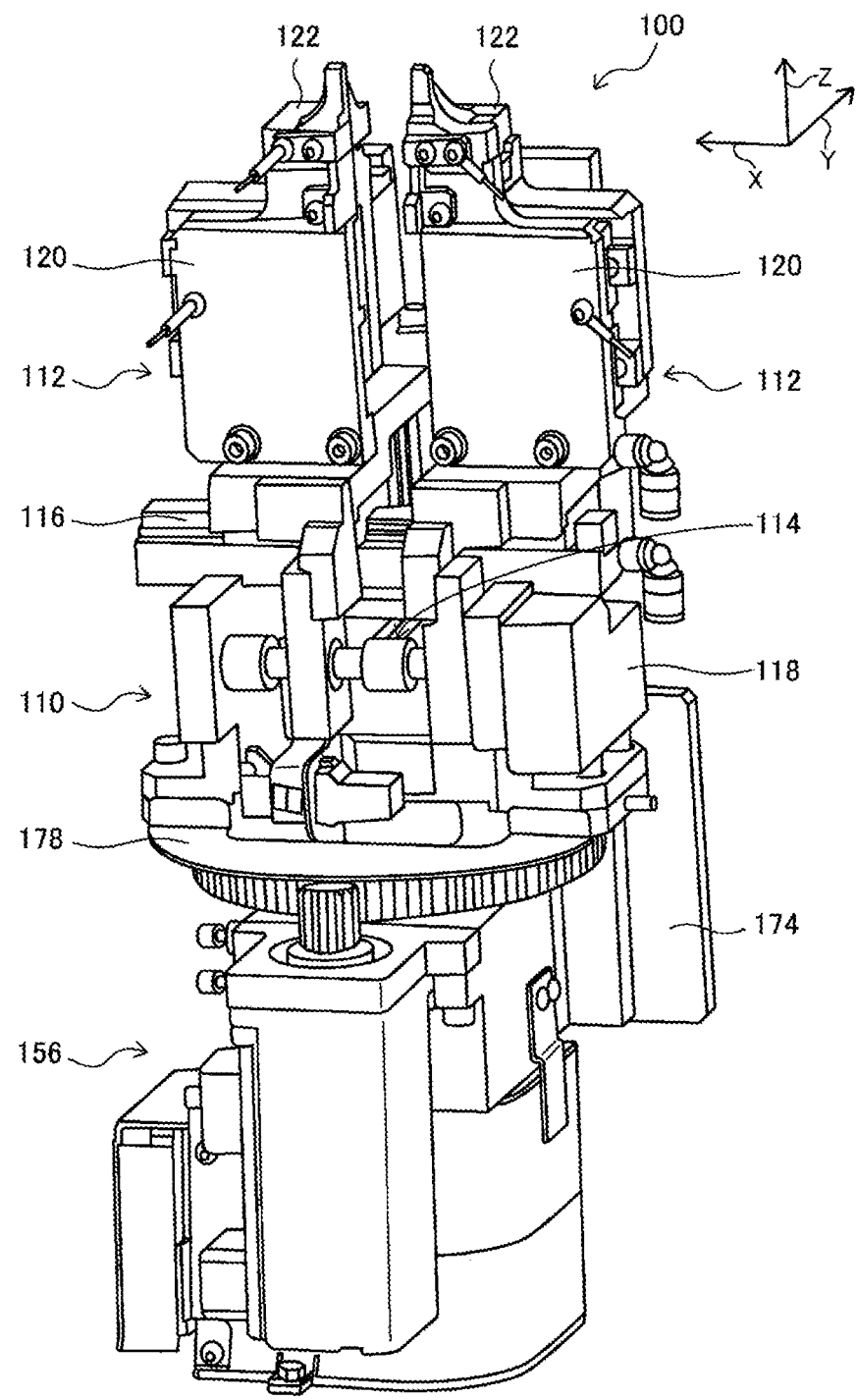
FIG. 4 is a perspective view of a cut and clinch unit.

Cut and clinch device 34 is arranged below conveyance device 50 and, as shown in FIG. 3, includes cut and clinch unit 100 and unit moving device 102. As shown in FIG. 4, cut and clinch unit 100 includes unit main body 110, pair of slide bodies 112, and pitch changing mechanism 114. At an upper end of unit main body 110, slide rail 116 is arranged extending in the X direction. The pair of slide bodies 112 is supported by slide rail 116 so as to be movable. Also, pitch changing mechanism 114 includes electromagnetic motor 118, and the distance between the pair of slide bodies 112 can be controllably changed by operation of electromagnetic motor 118.

Figure 5:
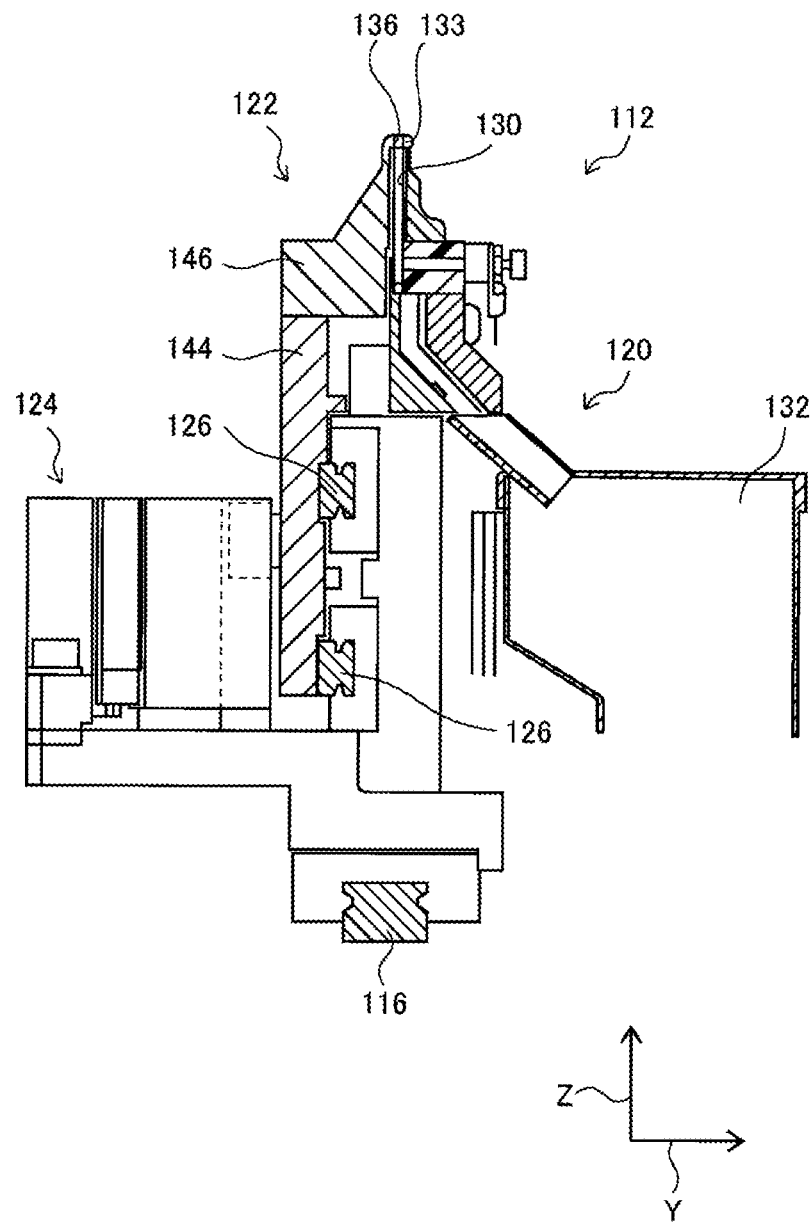
FIG. 5 is a cross section of a slide body.

Also, as shown in FIG. 5, each of the pair of slide bodies 112 includes main body section 120, movable section 122, and slide device 124, and is supported at main body section 120 so as to be slidable on slide rail 116. Two slide rails 126 are fixed to the rear side of main body section 120 extending in the X direction, and movable section 122 is slidably supported by those two slide rails 126. Also, slide device 124 includes electromagnetic motor (refer to FIG. 8) 128, and movable section 122 is controllably slid by operation of electromagnetic motor 128.

Also, the upper end section of main body section 120 is formed tapered towards the end, and first insertion hole 130 is formed so as to pierce the upper end section in a vertical direction. First insertion hole 130 is open at an upper end to an upper end surface of main body section 120, and is open at a lower end to a side surface of main body section 120. Note that, the edge of first insertion hole 130 that opens to the upper end surface of main body section 120 is formed as fixed blade 131 (refer to FIG. 9). Also, below where first insertion hole 130 opens to a side surface of main body section 120, discard box 132 is provided.

Figure 6:
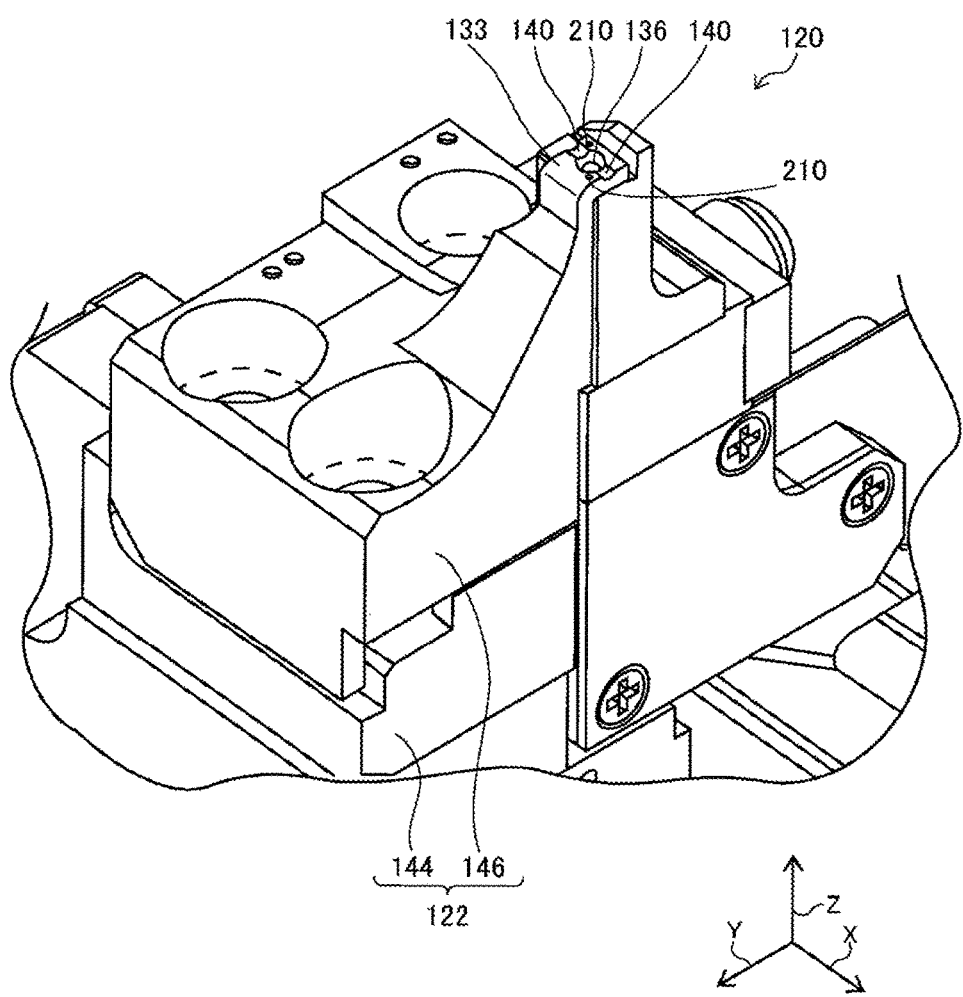
FIG. 6 is an enlarged view of the slide body.

Further, as shown in FIG. 6, an upper end section of movable section 122 is also formed tapered towards the end, and L-shaped curved section 133 is formed at the upper end section of movable section 122. Curved section 133 extends upwards of the upper end surface of main body section 120, and there is slight clearance between curved section 133 and the upper end of main body section 120. And, first insertion hole 130 that opens at the upper end surface of main body section 120 is covered by curved section 133, and second insertion hole 136 is formed in curved section 133 so as to face first insertion hole 130. Second insertion hole 136 pierces through curved section 133 in a vertical direction, and an internal surface of second insertion hole 136 is a tapered surface configured with a diameter that gets smaller going down. On the other hand, the internal surface of first insertion hole 130 approaching the opening to the upper end surface of main body section 120 is not a tapered surface, the internal surface of insertion hole 130 approaching the opening has an approximately regular diameter. Also, the edge of second insertion hole 136 that opens to the lower end surface of curved section 133 is formed as movable blade 138 (refer to FIG. 9).

Figure 7:
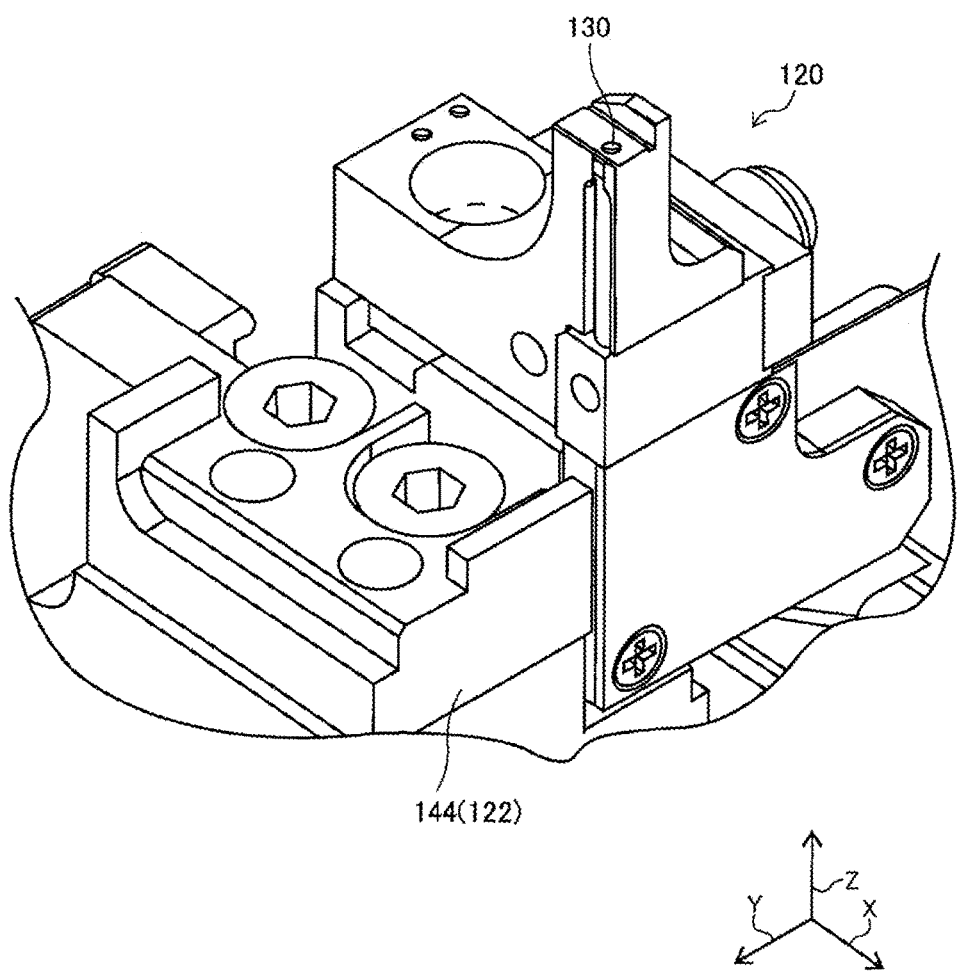
FIG. 7 is an enlarged view of a slide body in a state removed from a second section of a movable section.

Note that, guide groove 140 is formed in the upper end surface of curved section 133 extending in the X-axis direction. Guide groove 140 is formed to straddle the opening of second insertion hole 136, and guide groove 140 and second insertion hole 136 are linked. Also, movable section 122 is configured from first section 144 and second section 146. First section 144 configures a lower side portion of movable section 122, and as shown in FIG. 5, is slidably supported by slide rail 126. On the other hand, second section 146 configures an upper side portion of movable section 122, and includes curved section 133. Second section 146 and first section 144 are connected by bolts, and as shown in FIG. 7, it is possible to remove second section 146 from first section 144 by removing the bolts.

Also, as shown in FIG. 3, unit moving device 102 includes X-direction moving device 150, Y-direction moving device 152, Z-direction moving device 154, and rotating device 156. X-direction moving device 150 includes slide rail 160 and X slider 162. Slide rail 160 extends in the X direction, and X slider 162 is slidably supported on X slide rail 160. X slider 162 moves in the X direction by the driving of electromagnetic motor 164 (refer to FIG. 8). Y-direction moving device 152 includes slide rail 166 and Y slider 168. Slide rail 166 is arranged on X slider 162 extending in the Y direction, and Y slider 168 is slidably supported on slide rail 166. Y slider 168 moves in the Y direction by the driving of electromagnetic motor 170 (refer to FIG. 8). Z-direction moving device 154 includes slide rail 172 and Z slider 174. Slide rail 172 is arranged on Y slider 168 extending in the Z direction, and Z slider 174 is slidably supported on slide rail 172. Z slider 174 moves in the Z direction by the driving of electromagnetic motor 176 (refer to FIG. 8).

Further, rotating device 156 includes rotating table 178 that is roughly disc-shaped. Rotating table 178 is supported by Z slider 174 so as to be rotatable around its own center, and is rotated by the driving of electromagnetic motor 180 (refer to FIG. 8). Cut and clinch unit 100 is arranged on rotating table 178. According to such a configuration, cut and clinch unit 100 can be moved to any position by X-direction moving device 150, Y-direction moving device 152, and Z-direction moving device 154, and can be rotated to any angle by rotating device 156. Thus, second insertion hole 136 of cut and clinch unit 100 can be positioned at any position under circuit board 12 held by clamp device 52.

Figure 8:
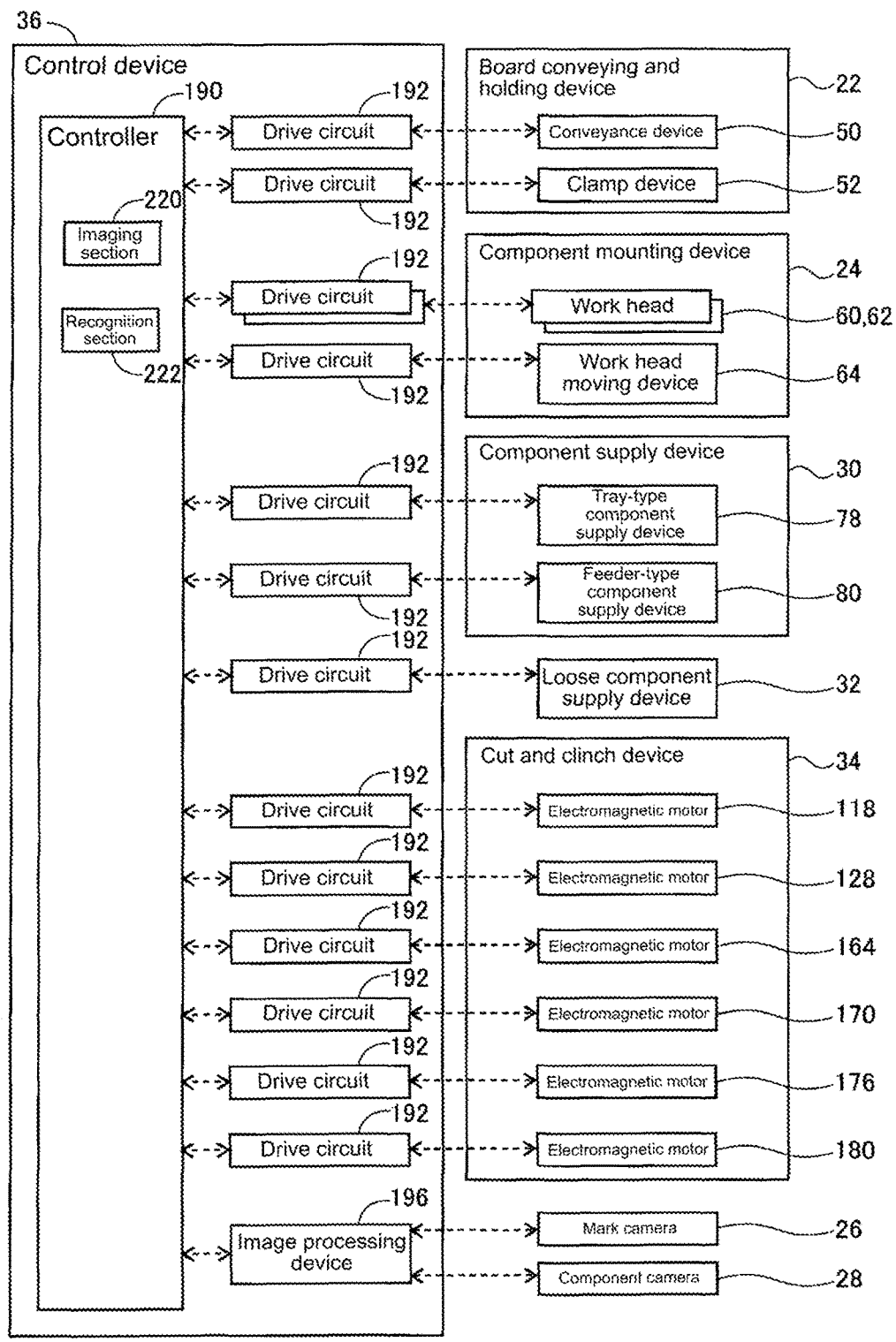
FIG. 8 is a block diagram showing a control device.

As shown in FIG. 8, control device 38 is provided with controller 190, multiple drive circuits 192, and image processing device 196. The multiple drive circuits 192 are connected to conveyance device 50, clamp device 52, work heads 60 and 62, work head moving device 64, tray type component supply device 78, feeder type component supply device 80, loose component supply device 32, and electromagnetic motors 118, 128, 164, 170, 176, and 180. Controller 190 is provided with a CPU, ROM, RAM, and so on, is formed mainly from a computer, and is connected to the multiple drive circuits 192. By this, operation of board conveying and holding device 22, component mounting device 24, and so on is controlled by controller 190. Further, controller 190 is also connected to image processing device 196. Image processing device 196 is for processing image data acquired by mark camera 26 and component camera 28, and controller 190 acquires various information from the image data.

Component Mounter Operation

Component mounter 10, according to the above configuration, mounts components on circuit board 12 held by board conveying and holding device 22. With component mounter 10, it is possible to mount various components to circuit board 12; descriptions are given below of a case in which components with leads (hereinafter also referred to as "leaded component") are mounted on circuit board 12.

Figure 9:
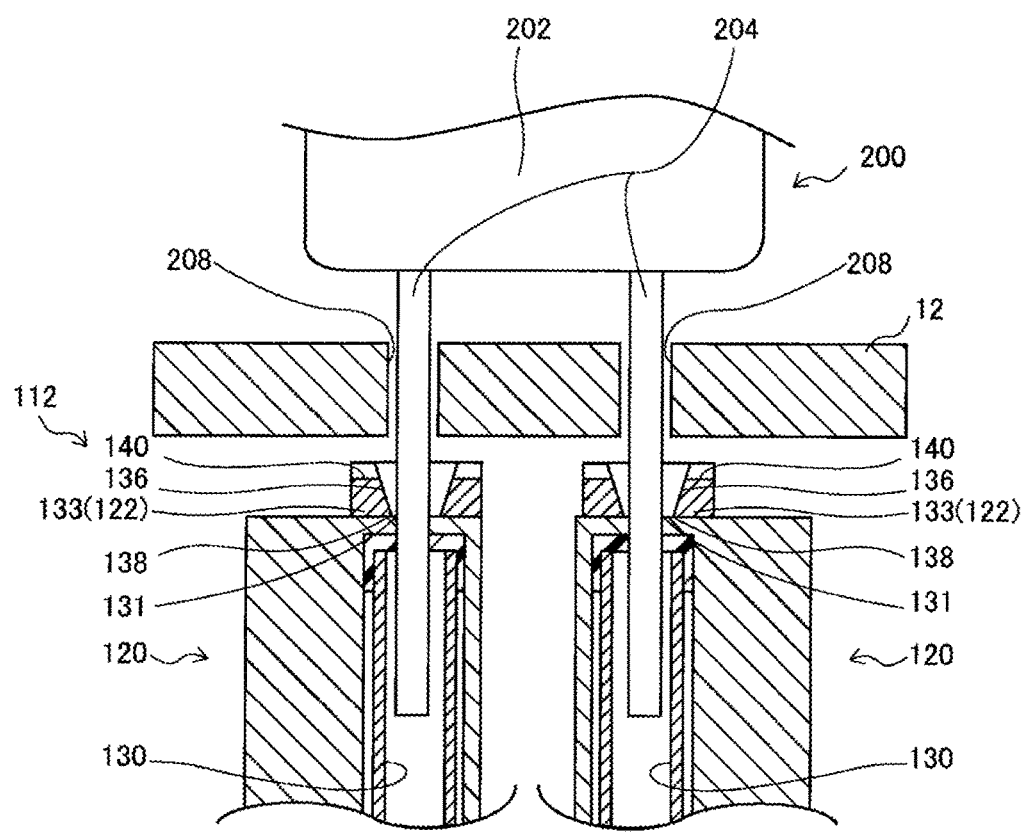
FIG. 9 is a schematic view of a cut and clinch unit immediately before a lead of a leaded component is cut.

Specifically, circuit board 12 is conveyed to a work position, and is fixedly held at that position by clamp device 52. Next, mark camera 26 moves above circuit board 12 and images circuit board 12. By this, information related to a holding position of circuit board 12 is obtained. Also, component supply device 30 or loose component supply device 32 supplies components at a specified supply position. One of the work heads 60 or 62 moves above the component supply position and holds a component using suction nozzle 66. Note, as shown in FIG. 9, leaded component 200 is configured from component main body section 202, and two leads 204 protruding from the bottom surface of component main body section 202. Leaded component 200 is picked up and held by a suction nozzle 66 on component main body section 202.

Continuing, work head 60 or 62 holding leaded component 200 is moved above component camera 28, and leaded component 200 held by suction nozzle 66 is imaged by component camera 28. Accordingly, information related to the holding position of the component is obtained. Continuing, work head 60 or 62 holding leaded component 200 moves above circuit board 12, and corrects the error in the holding position of circuit board 12 and the error in the holding position of the component and so on. Then, the two leads 204 of leaded component 200 held by suction nozzle 66 are inserted into two through-holes 208 formed in circuit board 12. Here, cut and clinch unit 100 is moved below circuit board 12. Cut and clinch unit 100 is moved such that coordinates in the XY directions of second insertion hole 136 of movable section 122 and coordinates in the XY directions of through-holes 208 of circuit board 12 match, the upper surface of movable section 122 and the lower surface of circuit board 12 do not contact each other, and the upper surface of movable section 122 is slightly below the lower surface of circuit board 12.

Specifically, with cut and clinch unit 100, the distance between the pair of slide bodies 112 is adjusted by pitch changing mechanism 114 such the distance between the pair of second insertion holes 136 of movable section 122 of slide body 122 is the same as the distance between the two through-holes 208 formed in circuit board 12. And, by operation of unit moving device 102, cut and clinch unit 100 is moved in the XYZ directions and rotated. Thus, the coordinates in the XY directions of second insertion hole 136 of movable section 122 and coordinates in the XY directions of through-holes 208 of circuit board 12 match, the upper surface of movable section 122 and the lower surface of circuit board 12 do not contact each other, and the upper surface of movable section 122 is slightly below the lower surface of circuit board 12.

Then, when leads 204 of leaded component 200 held by suction nozzle 66 are inserted into through-holes 208 of circuit board 12, as shown in FIG. 9, the end section of leads 204 is inserted into first insertion hole 130 of main body section 120 through second insertion hole 136 of movable section 122 of cut and clinch unit 100. Here, because the internal surface of second insertion hole 136 positioned below through-hole 208 is tapered, even in a case in which lead 204 is bent slightly, it is possible to ensure that the tip section of lead 204 appropriately enters second insertion hole 136.

Figure 10:
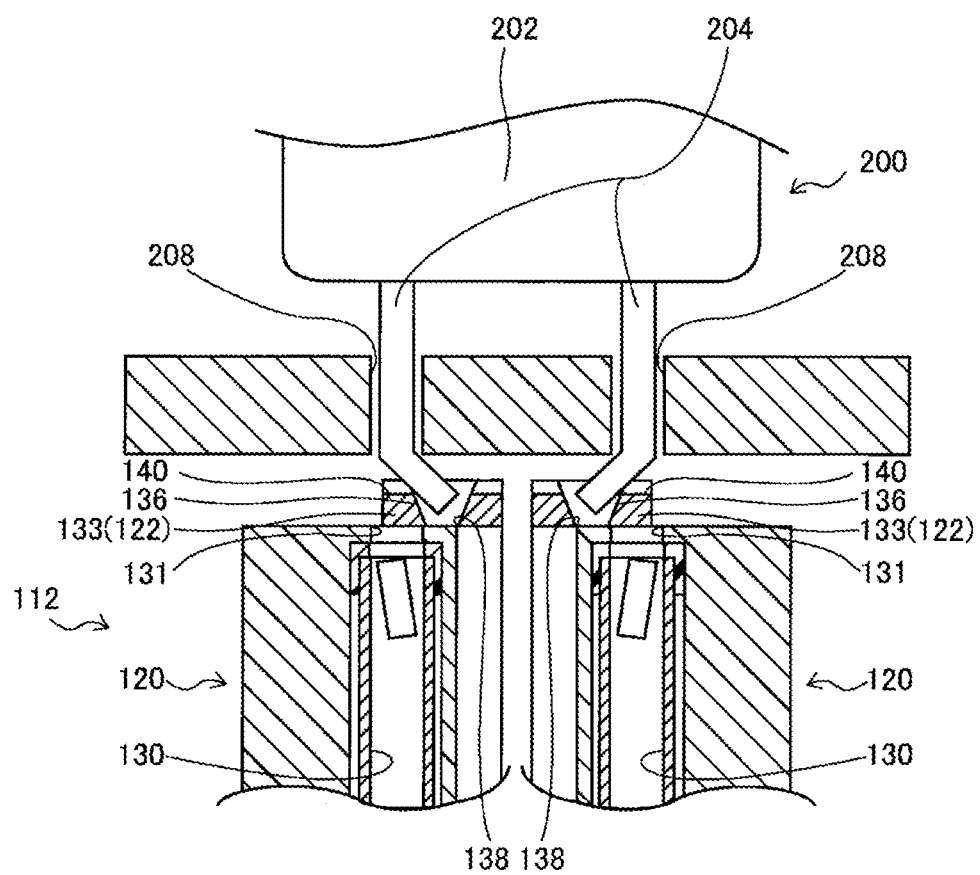
FIG. 10 is a schematic view of a cut and clinch unit after a lead of a leaded component has been cut.

Next, when the tip section of lead 204 has been inserted into first insertion hole 130 of main body section 120, movable section 122 is slid by operation of slide device 124. Thus, as shown in FIG. 10, lead 204 is cut by fixed blade 131 of first insertion hole 130 and movable blade 138 of second insertion hole 136. Then, the tip section separated by the cutting of lead 204 falls inside first insertion hole 130 and is discarded in discard box 132. Also, the new tip section formed by the cutting of lead 204 is bent along the tapered surface of the inside of second insertion hole 136 in accordance with the sliding of movable section 122, and the tip section of lead 204 is bent along guide groove 140 by the further sliding of movable section 122. Thus, leaded 200 component is mounted into circuit board 12 in a state in which leads 204 are prevented from coming out of through-holes 208.

In this manner, with component mounter 10, leaded component 200 is mounted into circuit board 12 by lead 204 being cut and bent by cut and clinch device 34. However, second insertion hole 136 into which lead 204 is inserted during cutting by cut and clinch device 34 is relatively small. Therefore, to insert lead 204 appropriately into second insertion hole 136, before moving cut and clinch unit 100 as above, it is necessary to appropriately recognize the opening position of second insertion hole 136 and to perform calibration. Thus, for example, it may be considered to image the opening of second insertion hole 136 using mark camera 26, and to recognize the opening position of second insertion hole 136 based on the image. However, because the internal surface of second insertion hole 136 is tapered, it is not possible to appropriately image the opening of second insertion hole 136 due to reflection of light from the tapered surface during imaging. Therefore, it is not possible to appropriately recognize the opening position of second insertion hole 136 by imaging the opening of second insertion hole 136.

Considering these circumstances, one may consider a method of imaging not second insertion hole 136 but first insertion hole 130 using mark camera 26, recognizing the position of first insertion hole 130 based on the image data, and recognizing the position of first insertion hole 130 instead of the position of second insertion hole 136. Specifically, before performing mounting work, in cut and clinch device 34, second section 146 of movable section 122 can be removed from first section 144 by removing bolts. By this, as shown in FIG. 7, the opening of first insertion hole 130 of main body section 120 is exposed. Mark camera 26 may be moved above this exposed opening of first insertion hole 130, and the opening of first insertion hole 130 may be imaged using mark camera 26. As described above, the internal surface of the opening section of first insertion hole 130 is not a tapered surface, the opening section of insertion hole 130 has an approximately regular diameter. Thus, problems arising due to reflection and so on from the tapered surface during imaging do not occur, and the opening of first insertion hole 130 can be appropriately imaged. Then, the opening position of first insertion hole 130 is recognized based on the image data. Also, because first insertion hole 130 and second insertion hole 136 overlap in the vertical direction in a state that virtually matches, the opening position of first insertion hole 130 can be recognized as the opening position of second insertion hole 136. In this manner, by imaging first insertion hole 130, it is possible to recognize the opening position of second insertion hole 136. However, to image the opening of first insertion hole 130, it is necessary to remove second section 146 of movable section 122 from first section 144, which puts a load on an operator. Therefore, with cut and clinch device 34, a recognition mark is provided on bent section 133 of movable section 122, and the opening position of second insertion hole 136 is recognized by imaging this recognition mark.

Figure 11:
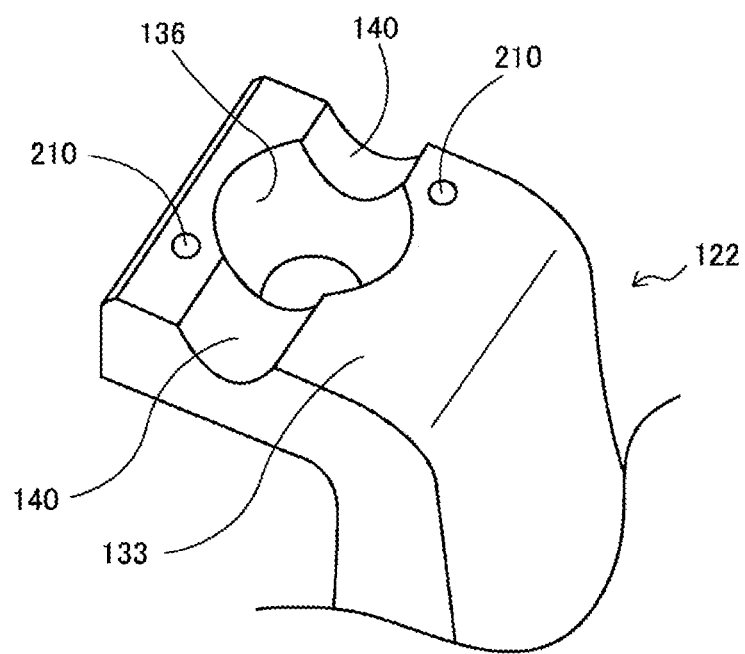
FIG. 11 is an enlarged view of a curved section of the movable section.

Specifically, as shown in FIG. 11, a pair of recognition marks 210 are provided on an upper surface of bent section 133 of movable section 122. These pair of recognition marks 210 are provided centered around the center of the opening of second insertion hole 136. That is, the center point of the pair of recognition marks 210 is the center of the opening of second insertion hole 136. Also, because recognition marks are provided at a position different to second insertion hole 136 and guide groove 140, it is possible to appropriately image recognition marks 210 using mark camera 26. Therefore, by imaging the pair of recognition marks 210 using mark camera 26, the position of the pair of recognition marks is recognized based on the image data. And, the center position of the pair of recognition marks 210 is calculated, and that position is recognized as the opening position of second insertion hole 136. By this, it is possible to appropriately recognize the opening position of second insertion hole 136.

In this manner, with cut and clinch device 34, the opening position of second insertion hole 136 is recognized by providing a recognition mark on bent section 133 of movable section 122, and recognizing the opening position of second insertion hole 136 by imaging this recognition mark. By this, it is possible to recognize the opening position of second insertion hole 136 without removing second section 146 of movable section 122, thereby reducing the load on the operator.

Note that, controller 190 of control device 38, as shown in FIG. 8, includes imaging section 220 and recognition section 222. Imaging section 220 is a functional section for imaging recognition mark 210 using mark camera 26. Recognition section 222 is a functional section for recognizing the opening position of second insertion hole 136.

Component mounter 10 is an example of a board work machine. Cut and clinch device 34 is an example of a cutting device. Control device 38 is an example of a recognition device. Unit moving device 102 is an example of a moving device. Main body section 120 is an example of a fixed section. Movable section 122 is an example of a movable section. First insertion hole 130 is an example of a first through-hole. Second insertion hole 136 is an example of a second through-hole and an upper through-hole. Leaded component 200 is an example of a leaded component. Lead 204 is an example of a lead. Recognition mark 210 is an example of a recognition mark. A process performed by imaging section 220 is an example of an imaging process. A process performed by recognition section 222 is an example of a recognition process. Note that, cutting may be performed by either one of the fixed section provided with the first through-hole or the movable section provided with the second through-hole moving, or by both the fixed section provided with the first through-hole and the movable section provided with the second through-hole moving. Also, either the fixed section or the movable section may be positioned above the other.

Further, the present invention is not limited to the above example embodiments, and various changed or improved methods of embodiment are possible based on the knowledge of someone skilled in the art. Specifically, for example, in an embodiment above, a pair of recognition marks 210 are provided on movable section 122, and the opening position of second insertion hole 136 is recognized using the pair of recognition marks 210; however, one recognition mark may be provided on movable section 122, and the opening position of second insertion hole 136 may be recognized using the single recognition mark.

Also, in an embodiment above, movable section 122 is provided above main body section 120, and the opening position of second insertion hole 136 of movable section 122 is recognized using a recognition mark; however, main body section 120 may be provided above movable section 122, and the opening position of first insertion hole 130 of main body section 120 may be recognized using the recognition mark. However, in this case, the internal surface of first insertion hole 130 must be tapered, and a recognition mark must be provided on main body section 120.

Also, in an embodiment above, recognition mark 210 is imaged automatically by mark camera 26, but the position of second insertion hole 136 may be recognized and a correction value or the like for calibration may be acquired by an operator moving mark camera 26 manually and imaging recognition mark 210.

REFERENCE SIGNS LIST

10: component mounter (board work machine); 34: cut and clinch device (cutting device); 38: control device (recognition device); 102: unit moving device (moving device); 120: main body section (fixed section); 122: movable section; 130: first insertion hole (first through-hole); 136: second insertion hole (second through-hole) (upper through hole); 200: lead; 204: leaded component; 210: recognition mark

The invention claimed is:

1. A board work machine comprising:
a provided with (A) a fixed section in which is formed a first insertion-hole and (B) a movable section configured to slide with respect to the fixed section and in which is formed a second insertion-hole configured to overlap the first insertion-hole, the cutting device being configured to cut a lead of a leaded component by the lead being inserted from above the cutting device into the first insertion-hole and the second insertion-hole that are in an overlapping state and sliding the movable section;
a moving device configured to move the cutting device;
a recognition device configured to recognize a position of an upper insertion-hole that is an upper-positioned one of the first insertion-hole and the second insertion-hole that are in the overlapping state, based on image data of an image taken from above the cutting device of one of the fixed section and the movable section in which the uppermost insertion-hole is formed, wherein an internal surface of the upper insertion-hole is a tapered surface with a diameter that becomes smaller going downward in the upper insertion-hole; and
a recognition mark for recognizing the position of the upper insertion-hole, the recognition mark being formed on the one of the fixed section and the movable section in which the upper insertion-hole is formed,
wherein the recognition device is configured to recognize the position of the upper insertion-hole based on image data of the recognition mark.

2. The board work machine according to claim 1, wherein a pair of the recognition marks are provided opposite each other, centered around the upper insertion-hole on the one of the fixed section and the movable section in which the upper insertion-hole is formed.

3. A recognition method for a cutting device provided with (A) a fixed section in which is formed a first insertion-hole and (B) a movable section configured to slide with respect to the fixed section and in which is formed a second insertion-hole overlapping the first insertion-hole to cut a lead of a leaded component by the lead being inserted from above the cutting device into the first insertion-hole and second insertion-hole and sliding the movable section, wherein a recognition mark is formed on the one of the fixed section and the movable section in which an upper insertion-hole is formed, the upper insertion-hole that being an upper-positioned one of the first insertion-hole and the second insertion-hole that are in the overlapping state, wherein an internal surface of the upper insertion-hole is a tapered surface with a diameter that becomes smaller going downward in the upper insertion-hole, the recognition method comprising:
imaging the recognition mark of the one of the fixed section and the movable section in which the upper insertion-hole is formed, from above the cutting device; and
recognizing the position of the upper insertion-hole based on image data of the recognition mark obtained by the imaging.

4. The method according to claim 3, wherein a pair of the recognition marks are provided opposite each other, centered around the upper insertion-hole on the one of the fixed section and the movable section in which the upper insertion-hole is formed, and wherein the step of recognizing the position of the upper insertion-hole comprises determining a center point of the pair of recognition marks as the center of the upper insertion-hole.

* * * * *